US007242620B2

(12) United States Patent
Nagashima

(10) Patent No.: US 7,242,620 B2
(45) Date of Patent: Jul. 10, 2007

(54) NONVOLATILE SEMICONDUCTOR MEMORY DEVICE AND AN OPERATION METHOD THEREOF

(75) Inventor: Hiroyuki Nagashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/240,510

(22) Filed: Oct. 3, 2005

(65) Prior Publication Data

US 2006/0083071 A1 Apr. 20, 2006

(30) Foreign Application Priority Data

Oct. 5, 2004 (JP) .............................. 2004-292558

(51) Int. Cl.
*G11C 16/06* (2006.01)
*G11C 7/10* (2006.01)

(52) U.S. Cl. .............................. 365/185.21; 365/189.05

(58) Field of Classification Search ............ 365/185.21
See application file for complete search history.

(56) References Cited

U.S. PATENT DOCUMENTS

| 5,453,955 | A | | 9/1995 | Sakui et al. | |
|---|---|---|---|---|---|
| 5,652,719 | A | * | 7/1997 | Tanaka et al. | ......... 365/185.03 |
| 5,847,992 | A | * | 12/1998 | Tanaka et al. | ......... 365/185.03 |
| 5,862,074 | A | * | 1/1999 | Park | ....................... 365/185.03 |
| 6,064,611 | A | * | 5/2000 | Tanaka et al. | .............. 365/203 |
| 6,154,403 | A | * | 11/2000 | Tanzawa et al. | ............ 365/203 |
| 6,266,270 | B1 | * | 7/2001 | Nobukata | ............... 365/185.03 |
| 6,826,082 | B2 | * | 11/2004 | Hwang et al. | ......... 365/185.17 |
| 6,888,758 | B1 | * | 5/2005 | Hemink et al. | ........ 365/185.22 |
| 6,940,752 | B2 | * | 9/2005 | Tanaka et al. | ......... 365/185.03 |
| 6,996,014 | B2 | * | 2/2006 | Lee et al. | ............... 365/189.05 |
| 7,061,813 | B2 | * | 6/2006 | Lee | ........................ 365/189.05 |
| 2005/0276116 | A1 | * | 12/2005 | Ide et al. | ................ 365/185.22 |

FOREIGN PATENT DOCUMENTS

| JP | 4-276393 | 10/1992 |
|---|---|---|
| JP | 8-147990 | 6/1996 |
| JP | 9-35486 | 2/1997 |

OTHER PUBLICATIONS

U.S. Appl. No. 11/235,206, filed Sep. 27, 2005, Kameda et al.
U.S. Appl. No. 11/240,510, filed Oct. 3, 2005, Nagashima.

* cited by examiner

*Primary Examiner*—Son L. Mai
(74) *Attorney, Agent, or Firm*—Oblon, Spivak, McClelland, Maier & Neustadt, P.C.

(57) ABSTRACT

A nonvolatile semiconductor memory device comprises a memory cell array which a plurality of an electrically rewritable nonvolatile memory cell is arranged and a sense amplifier having first, second and third circuits holding write-in data; and the first circuit receives data from the outside and transmits the data to the second circuit and the third circuit, and the second circuit and the third circuit transmit the data to two adjacent bit lines respectively, and the data is written in simultaneously to a memory cell selected among the nonvolatile memory cells connected to the two adjacent bit lines.

20 Claims, 15 Drawing Sheets

NONVOLATILE SEMICONDUCTOR MEMORY DEVICE AND AN OPERATION METHOD THEREOF

CROSS-REFERENCES TO RELATED APPLICATIONS

This application is based upon and claims the benefit of priority from the prior Japanese Patent Applications No. 2004-292558, filed on Oct. 5, 2004, the entire contents of which are incorporated herein by reference.

BACKGROUND OF THE INVENTION

1. Field of the Invention

This invention relates to an electrically rewritable nonvolatile semiconductor memory device. Among nonvolatile semiconductor memories, it especially relates to a NAND type flash memory.

2. Description of Related Art

In recent years, the demand of small nonvolatile semiconductor memories with large capacity increases rapidly, and the NAND type flash memory which can expect high integration and large capacity has especially attracted attention, compared with the conventional NOR type flash memory.

For the purpose of manufacturing a NAND type flash memory with large capacity, chip shrink for high integration will be promoted. However, as chip shrink progresses, a bit line interval is shortened and the contiguity capacity of the bit line is getting large. These days, the contiguity bit line capacity has reached 80% of the whole bit line capacity. It is considered that as capacity of a flash memory becomes large, the chip shrink further progresses and the contiguity bit line capacity is going to be larger.

In the NAND type flash memory, in order to make the consumption current of sense amplifier (S/A) small, the "voltage sense method" which detects the electric charge of a bit line is adopted. The sense operation of the data in the NAND type flash memory of the voltage sense method is as follows.

(1) Store the electric charge in the bit line beforehand (precharge).

(2) When a NAND memory cell turns on, because the precharged electric charge passes through a NAND memory cell, the potential of the bit line becomes VSS (discharge).

(3) When the NAND memory cell does not turn on, because the precharged electric charge is not drawn out, the potential of the bit line is maintained as the precharged potential. In this case, the bit line is floating.

(4) At the time when the discharge ended, data is read by detecting the voltage level of the bit line with a sense amplifier.

Due to the fact that the chip shrink has progressed and the contiguity bit line capacity has become large in recent years, regarding the bit line adjoining the bit line in a floating state in the above-mentioned state of (3) (i.e. the state which the NAND memory cell does not turn on), when discharge of the bit line described in the above-mentioned (2) is performed, it is influenced by the contiguity capacity of the bit line and the potential of the bit line in floating also decreases. Thus, what is called "coupling" phenomenon arises. Originally, in the above-mentioned state of (3), the potential of the bit line should have maintained the precharged level. However, the potential of the bit line decreases due to the influence of coupling, and an incorrect sense is caused. Therefore, there is a case where it becomes impossible to perform exact read-out operation. In order to avoid the incorrect sense caused by the influence of this coupling, for example, the method of shielding an adjoining bit line is adopted these days, as indicated by U.S. Pat. No. 5,453,955.

In this method of shielding the adjoining bit line (hereinafter referred to as the "bit line shielding method"), one sense amplifier circuit (S/A and latch) is shared by two bit lines as shown in FIG. 1. That is, the adjoining bit lines are classified into even number (Even) and odd number (Odd), and the structure that the adjoining bit lines of even number and odd number share one sense amplifier is adopted.

In read-out operation of this bit line shielding method, when the data of the bit line of even number are read out (when even-numbered pages are read out), transfer gates for the even-bit lines (BLSe) are turned on, and the even-bit lines are connected to the sense amplifier. At this time, by turning on transistors for grounding (BIASo) the odd-bit lines are connected to BLCRL to become grounding potential (VSS). Under this state, if potential (VDD) is precharged from the sense amplifier (S/A) on the even-bit lines, since the potential of the odd-bit lines are held at VSS, the even-bit lines are not influenced by the odd-bit lines, and precharge is performed appropriately.

On the other hand, when reading the data of the odd-bit lines, the transfer gate for the odd-bit lines (BLSo) is turned on, and the odd-bit lines are connected to the sense amplifier. At this time, by turning on the transistor for grounding (BIASe), the even-bit lines are connected to BLCRL to make grounding potential (VSS). If the potential (VDD) is precharged from the sense amplifier (S/A) on the odd-bit lines under this state, since the potential of the even-bit lines are held at VSS, the odd-bit lines are not influenced by the even-bit lines, and precharge is performed appropriately.

Thus, in the bit line shielding method, by making the adjoining non-selected bit line into a grounding state at the time of read-out operation, it becomes possible to perform exact read-out operation, without being influenced by the signal of the adjoining bit line.

At the time of write-in operation of data (at the time of program operation), in order to speed up write-in speed, since the adjoining bit lines do not influence each other, it is desirable to write in the even-bit line and the odd-bit line simultaneously.

However, in the conventional NAND type flash memory using the bit line shielding method shown in FIG. 1, it is impossible to write in the even-bit lines and the odd-bit lines simultaneously due to a circuit structure. Therefore, it is necessary to write data to the even-bit lines and the odd-bit lines by turns at the time of writing data. On the other hand, the demand to speed up the NAND type flash memory in a market is increasing, it is desired to realize that the even-bit lines and the odd-bit lines are written in simultaneously and the whole system of the NAND type flash memory speeds up.

SUMMARY OF THE INVENTION

In the nonvolatile semiconductor memory device of one embodiment of this invention and its operation method, a sense amplifier has a circuit receiving and holding data from the outside and two circuits receiving and holding the data transmitted from that circuit. These circuits transmit said data to two bit lines, and said data is simultaneously written in the memory cells selected among the nonvolatile memory cells connected to two adjacent bit lines. Therefore, in the nonvolatile semiconductor memory of one embodiment of this invention and its operation method, data can be simultaneously written in the even-bit lines and the odd-bit lines.

A nonvolatile semiconductor memory device of one embodiment of this invention comprises:

a memory cell array which a plurality of an electrically rewritable nonvolatile memory cell are arranged; and a sense amplifier having first, second and third circuits holding write-in data, said first circuit receiving data from the outside and transmits said data to said second circuit and said third circuit, said second circuit and said third circuit transmitting said data to two adjacent bit lines respectively; and wherein said data is written in simultaneously to a memory cell selected among said nonvolatile memory cells connected to said two adjacent bit lines.

BRIEF DESCRIPTION OF THE DRAWINGS

The accompanying drawings, which are incorporated into and form a part of the specification, illustrate one or more embodiments of the present invention, together with the description, serve to explain the principals of the invention. The drawings are only for the purpose of illustrating one or more preferred embodiments of the invention and are not to be construed as limiting the invention. In the drawings.

DETAILED DESCRIPTION OF THE PREFERRED EMBODIMENTS

Figure 1:
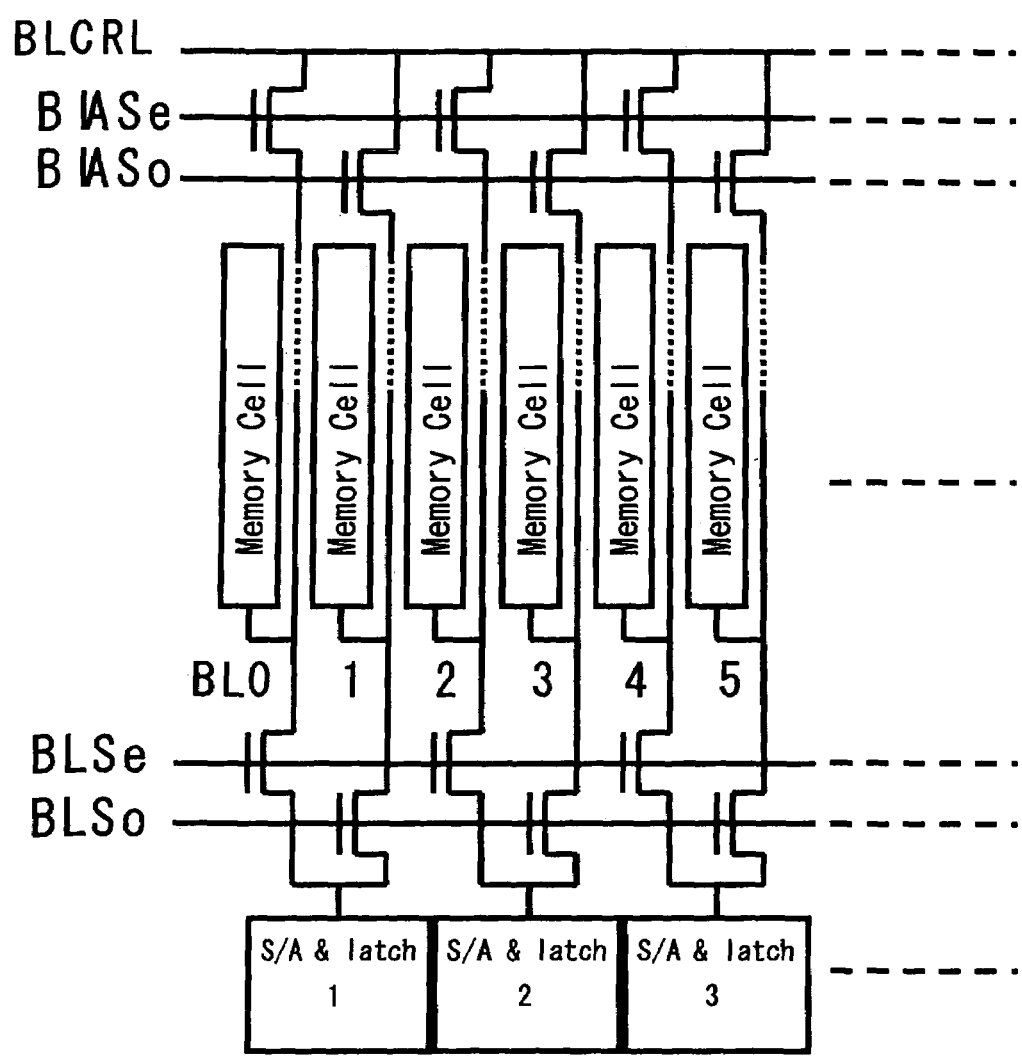
FIG. 1 is an outline block diagram of a memory cell array and sense amplifiers of a NAND type flash memory.
Figure 2:
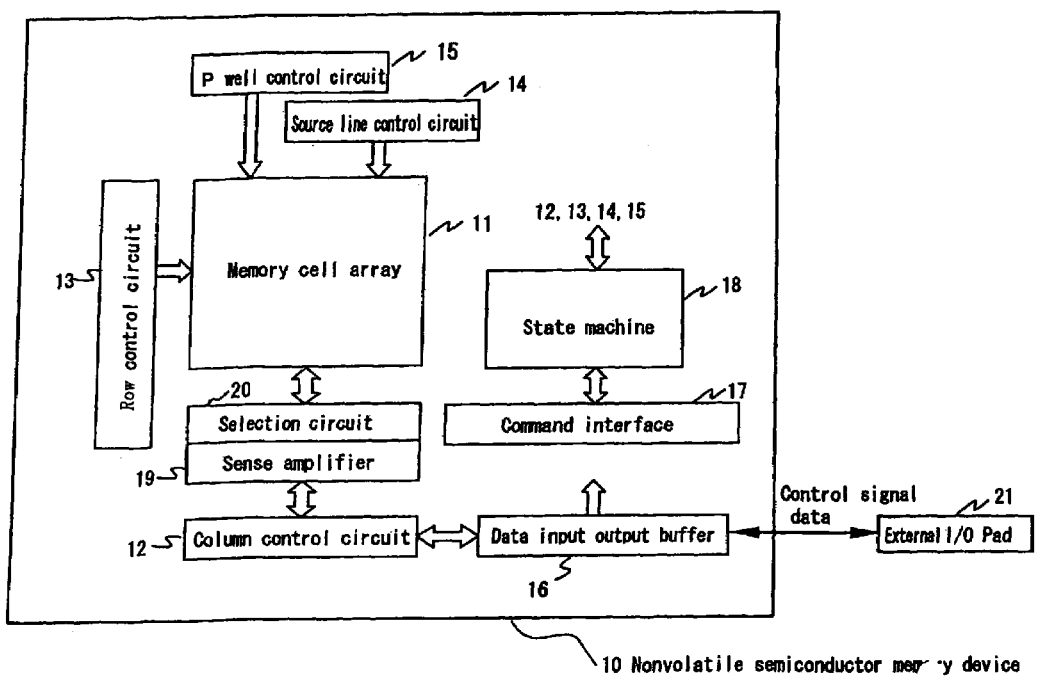
FIG. 2 is an outline block diagram of one embodiment of the nonvolatile semiconductor memory of one embodiment of this invention.

The outline block diagram of the nonvolatile semiconductor memory device 10 of one embodiment of the present invention concerning this embodiment is shown in FIG. 2. The nonvolatile semiconductor memory 10 of one embodiment of the present invention concerning this embodiment comprises a memory cell array 11, a column control circuit (column decoder) 12, a row control circuit (row decoder) 13, a source line control circuit 14, a P well control circuit 15, a data input-and-output buffer 16, a command interface 17, a state machine 18, a sense amplifier 19 and a selection circuit 20. The nonvolatile semiconductor memory 10 of one embodiment of this invention concerning this embodiment performs transmission and reception of data and a control signal (command) with an external I/O pad 21.

In the nonvolatile semiconductor memory 10 of one embodiment of this invention concerning this embodiment, data and the control signal are inputted into the command interface 17 and the column control circuit 12 through the data input-and-output buffer 16 from the external I/O pad 21. The state machine 18 controls the column control circuit 12, the row control circuit 13, the source line control circuit 14 and the P well control circuit 15 based on the control signal and the data. The state machine 18 outputs the access information over the memory cell of the memory cell array 11 to the column control circuit 12 and the row control circuit 13. Based on the subject access information and the data, the column control circuit 12 and the row control circuit 13 control the sense amplifier 19 and the selection circuit 20, and thereby activate the memory cell, and perform read-out, writing or erasing of data. The sense amplifier 19 connected to each bit line of the memory cell array 11 loads the data to a bit line, and detects the potential of the bit line, and holds it in a data cache. In addition, the data read from the memory cell by the sense amplifier 19 controlled by the column control circuit 12 is outputted to the external I/O pad 21 through the data input-and-output buffer 16. The selection circuit 20 selects the data cache connected with the bit line among a plurality of data caches which constitutes the sense amplifier.

Figure 3A:
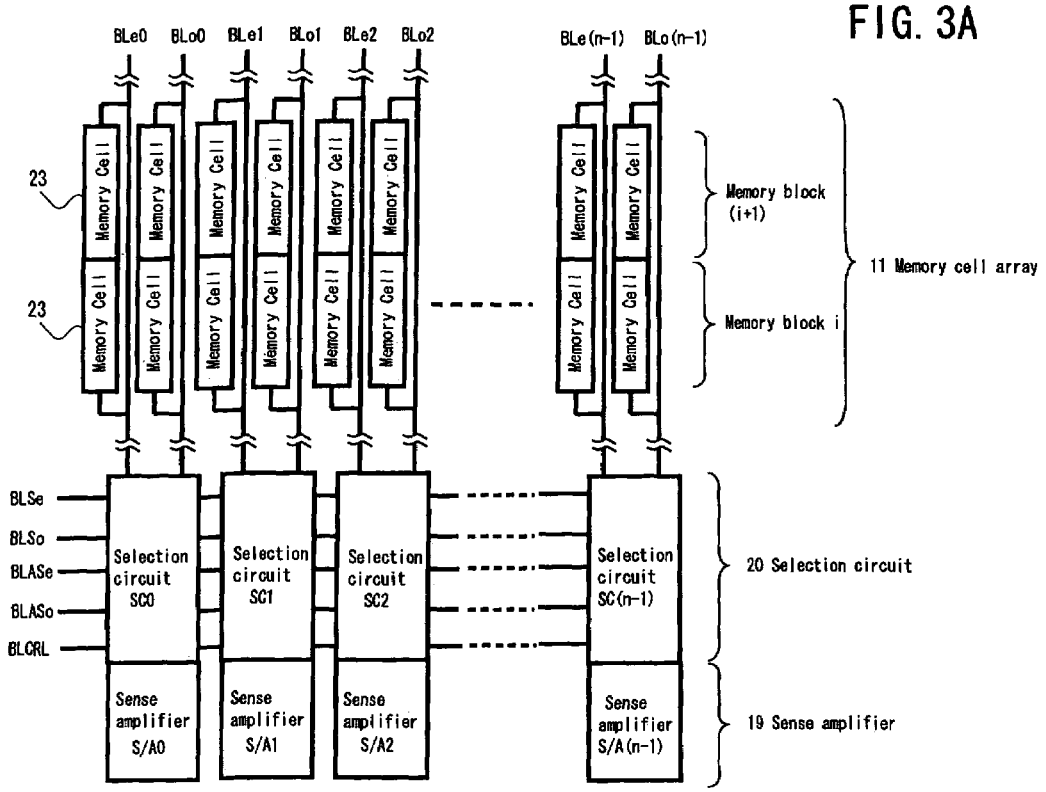
FIG. 3A is an outline block diagram of the memory cell array, the sense amplifiers and the selection circuits concerning one embodiment of the nonvolatile semiconductor memory of one embodiment of this invention.
Figure 3B:
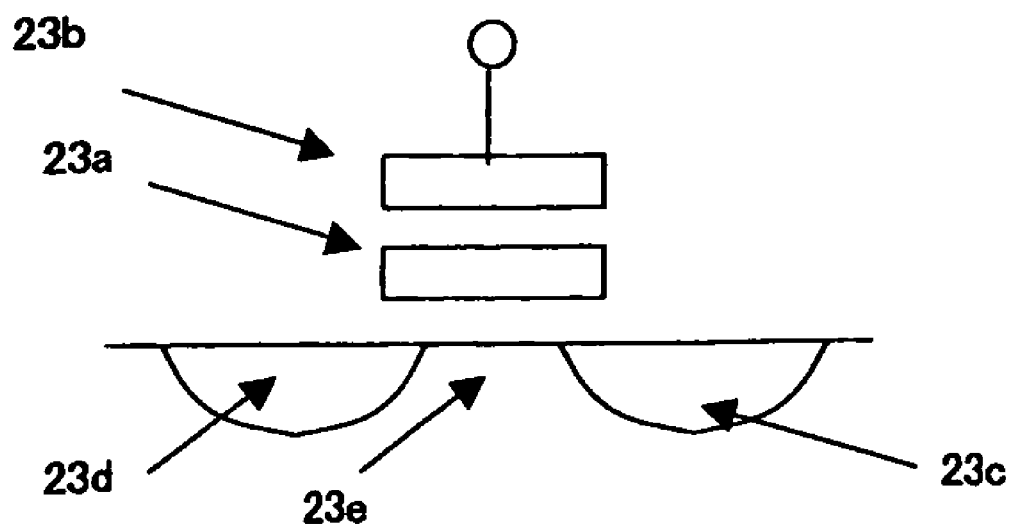
FIG. 3B is a cross sectional view of a memory cell concerning one embodiment of the nonvolatile semiconductor memory of one embodiment of this invention.

Next, FIG. 3A is referred to. FIG. 3A shows the outline block diagram of the memory cell array 11, the sense amplifier 19 and the selection circuit 20 of the nonvolatile semiconductor memory 10 of one embodiment of this invention concerning this embodiment. In this embodiment, the memory cell array 11 has m units of memory blocks having 2n units of the memory cell 23. In FIG. 3, the memory block i and the memory block (i+1) are shown typically. The memory cell 23 is connected to the bit lines BLe0, BLo0, BLe1, BLo1, BLe2, BLo2, . . . , BLe (n−1) BLo (n−1), respectively. The sense amplifier 19 has n units of the sense amplifier (S/A0-S/A (n−1)). The selection circuit 20 has n units of the selection circuits (SC0, SC1, . . . , SC (n−1)). One even-bit line and one odd-bit line form a pair, and one sense amplifier (S/A) and one selection circuit (SC) are shared. In the nonvolatile semiconductor memory 10 of one embodiment of this invention, an end of each bit line of the memory cell array 11 is floating. In addition, as shown in FIG. 3B, the memory cell 23 has a source/drain 23c and 23d and a channel forming region 23e, and it comprises a structure which an electric charge accumulation layer 23a and a control gate 23b are laminated.

Figure 4:
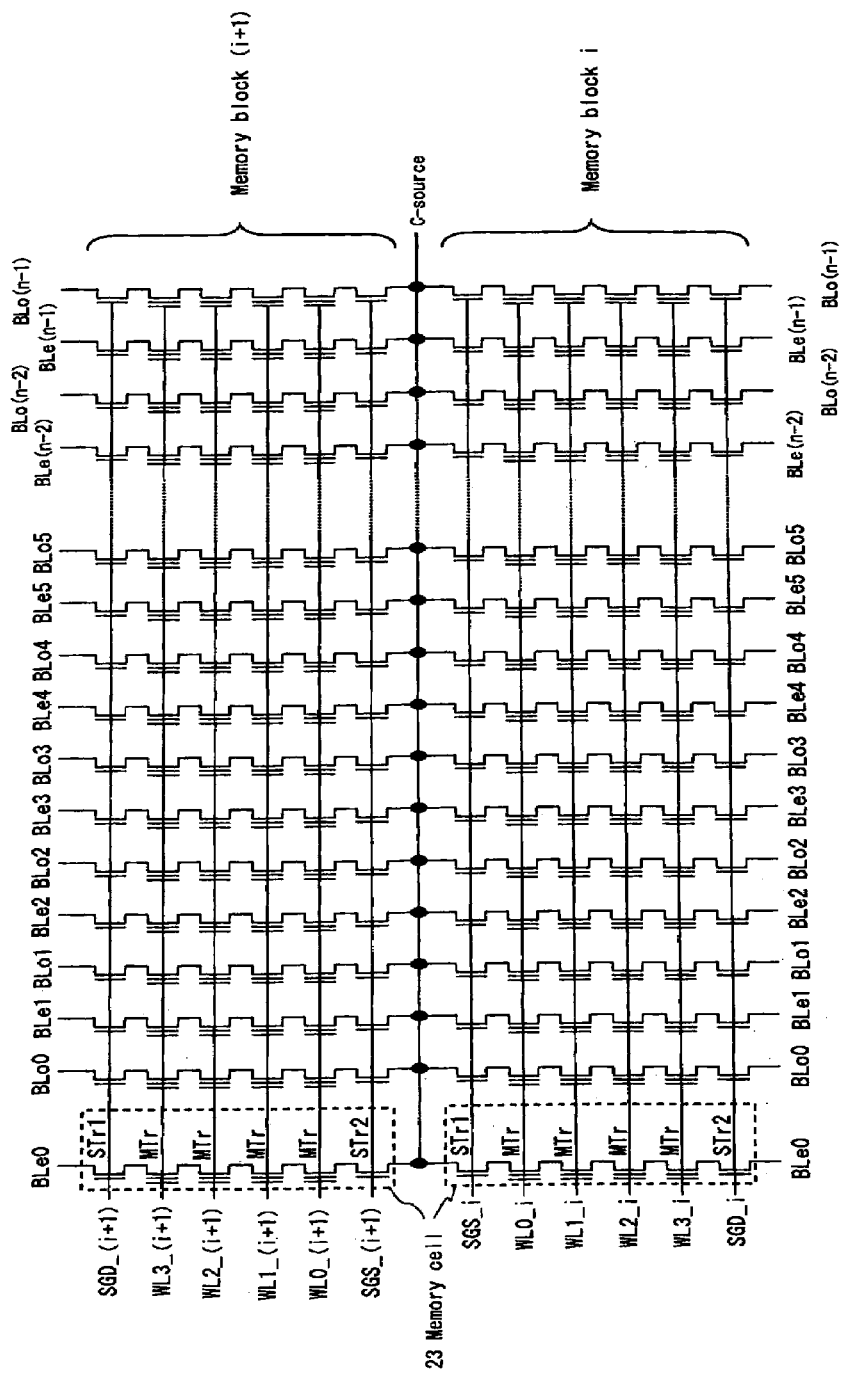
FIG. 4 is a circuit block diagram of the memory cell of the memory cell array concerning one embodiment of the nonvolatile semiconductor memory of one embodiment of this invention.

The circuit structure of the memory cell 23 of the memory cell array 11 is shown in FIG. 4. Although the memory block i and the memory block (i+1) are shown here among the memory cell blocks which constitute the memory cell array, the circuit structure of other memory blocks is also the same.

The memory cell 23 has three memory transistors MTr and two selection gate transistors STr1 and STr2, respectively. The memory cell 23 which constitutes the memory block i and the memory cell 23 which constitutes the memory block (i+1) share the source line (C-source) in common. In this embodiment, although string length of the NAND memory cell is set to 4 (WL0 to WL3), string length may be 16 or 32 or others. In addition, page length (the number of 2n of bit lines) is 2 kByte adding the even-bit lines and the odd-bit lines. The number of memory blocks (m) is set to 1024. The number of the memory blocks of the nonvolatile semiconductor memory 10 of one embodiment of this invention concerning this embodiment, the string length and the page length of the NAND memory cell are not necessarily limited to the number described in this embodiment, and they may be changed appropriately according to a desired storage capacity. The number of the selection gate transistors is not necessarily limited to this, either.

Figure 5:
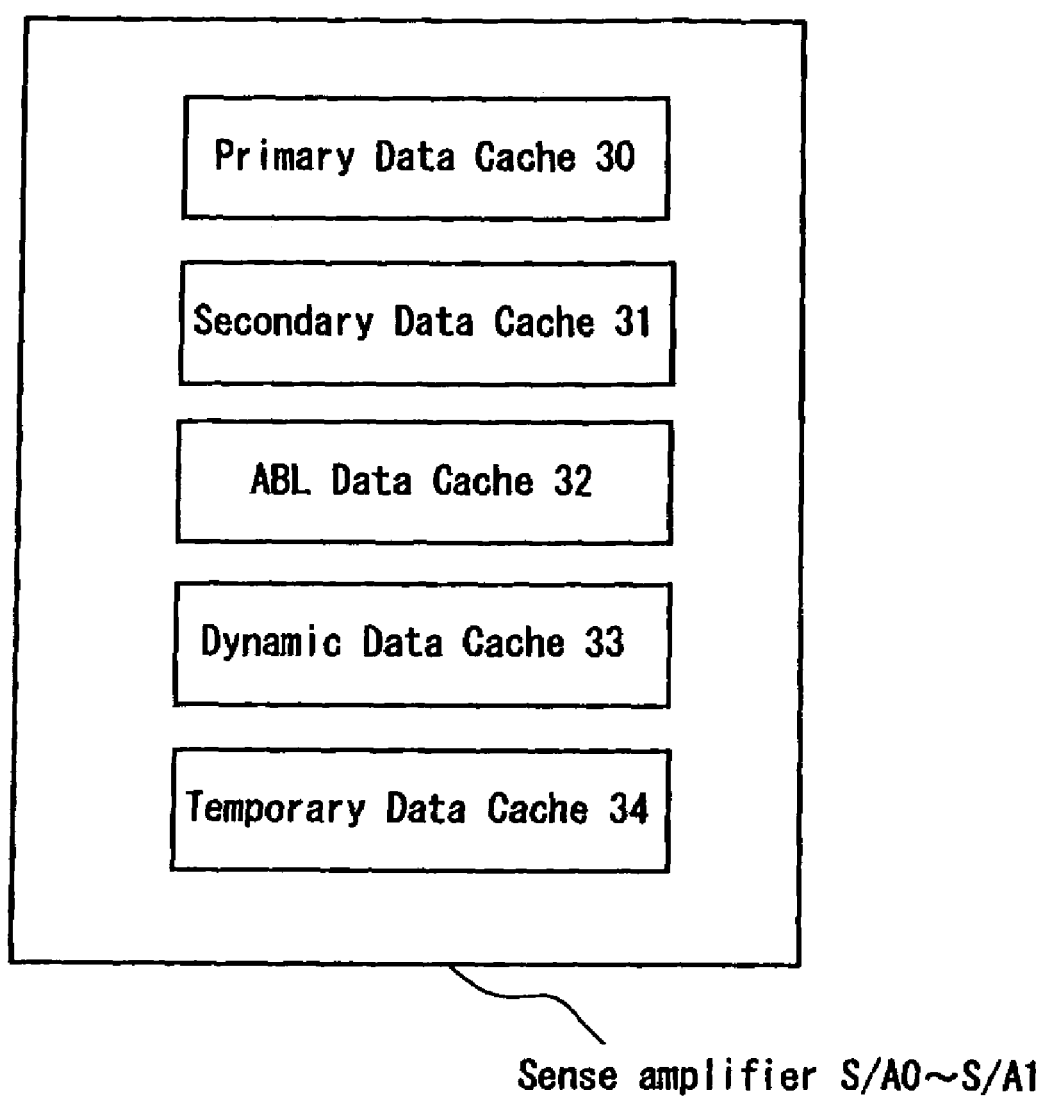
FIG. 5 is an outline block diagram of the sense amplifier concerning one embodiment of the nonvolatile semiconductor memory of one embodiment of this invention.

Next, FIG. 5 is referred to. FIG. 5 shows the outline block diagram of the sense amplifier S/A0 of the sense amplifier 19 concerning this embodiment. The sense amplifier SA1 to SA (n−1) of the sense amplifier 19 has the same structure as the sense amplifier S/A0. As shown in FIG. 5, the sense amplifier S/A0 has primary data cache 30 (PDC), secondary data cache 31 (SDC), ABL data cache 32 (ADC), dynamic data cache 33 (DDC) and temporary data cache 34 (TDC). Dynamic data cache 33 and temporary data cache 34 may be provided according to need. Dynamic data cache 33 can be used also as cache holding the data for writing the middle potential (VQPW) between VDD (high potential) and VSS (low potential) in the bit line.

Figure 6:
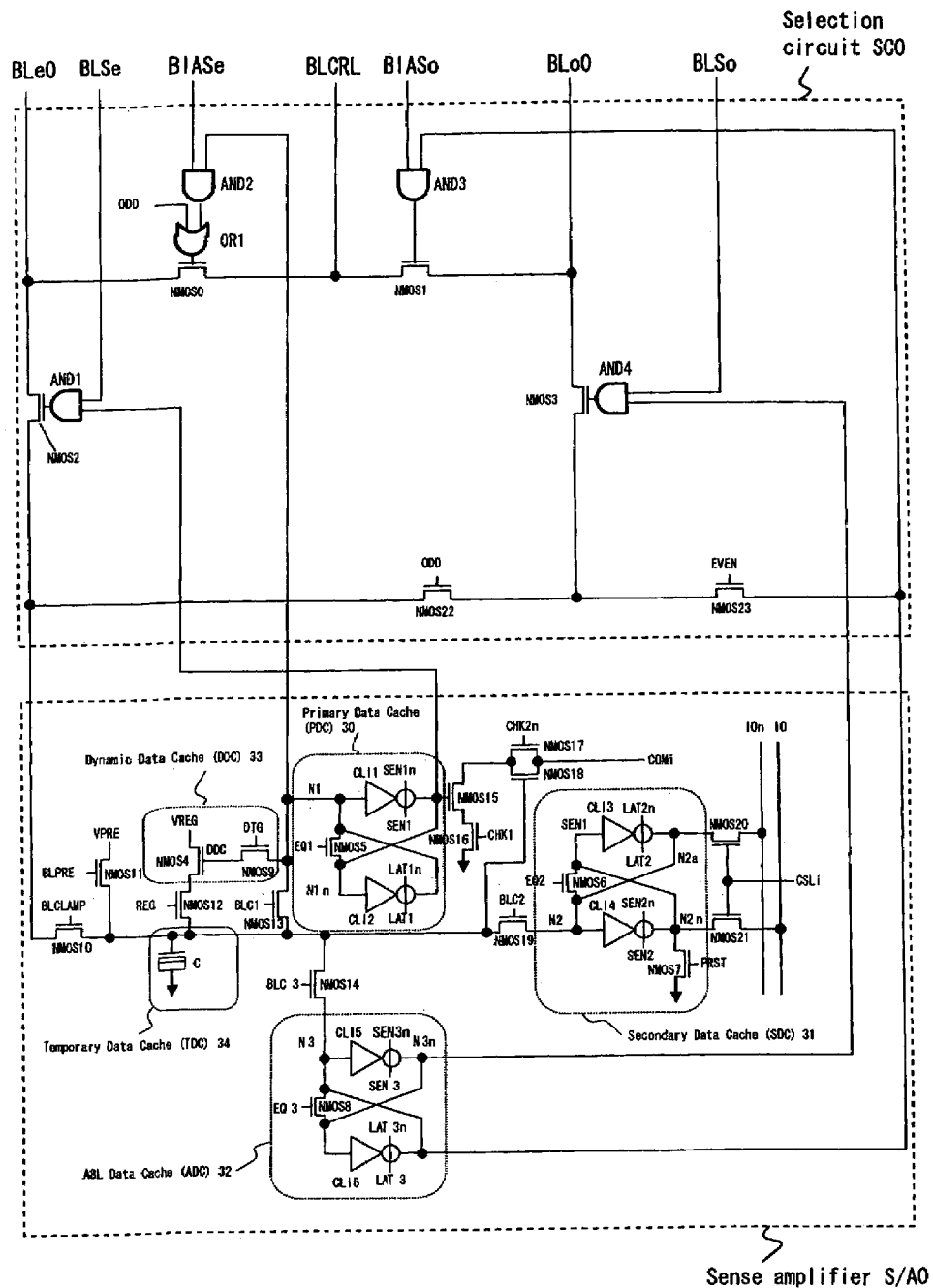
FIG. 6 shows the circuit structure of the sense amplifier and the selection circuit concerning one embodiment of the nonvolatile semiconductor memory of one embodiment of this invention.

Next, FIG. 6 is referred to. The sense amplifier 19 and the circuit structure of the selection circuit 20 of this embodiment are shown in FIG. 6. Although the sense amplifier SA0 and the selection circuit SC0 connected to the even-bit lines BLe0 and the odd-bit lines BLo0 are typically shown in FIG. 6 for convenience of the drawing, the other sense amplifiers SA1 to SA (n−1) and the selection circuits SC1 to SC (n−1) have the same circuit structures.

The sense amplifier S/A0 has primary data cache (PDC) 30, secondary data cache (SDC) 31, ABL data cache (ADC) 32, dynamic data cache (DDC) 33 and temporary data cache (TDC) 34 as mentioned above. In this embodiment, the primary data cache 30 has clocked inverters CLI1 and CLI2 and an N channel type transistor NMOS5. The secondary data cache 31 has clocked inverters CLI3 and CLI4 and N channel type transistors NMOS6 and NMOS7. The ABL data cache 32 has clocked inverters CLI5 and CLI6 and an N channel type transistor NMOS8. The dynamic data cache 33 has N channel type transistors NMOS4 and NMOS9. The temporary data cache 34 has a capacity C. The circuit structure of the primary data cache 30, the secondary data cache 31, the ABL data cache 32, the dynamic data cache 33 and the temporary data cache 34 is not necessarily limited the structure described in FIG. 6, and other circuit structure can also be adopted.

The sense amplifier S/A0 has N channel type transistors NMOS11 to NMOS20 for controlling input and output of the data in these data caches. In this embodiment, although the N channel type transistors NMOS5 to NMOS20 are used, input and output of the data may be controlled in these data caches by using P channel transistors.

One of the characteristics of the nonvolatile semiconductor memory 10 of one embodiment of this invention is that the sense amplifier S/A0 is equipped with the ABL data cache 32. The ABL data cache 32 is to latch the data temporarily, and its size may be smaller than the primary data cache 30 and the secondary data cache 31. Therefore, even if the ABL data cache 32 is added to the conventional sense amplifier, there is almost no increase in an occupied area.

The selection circuit SC0 has AND circuits AND1 to AND4 and N channel type transistors NMOS0 to NMOS3, NMOS22 and NMOS23. Regarding the selection circuit SC0, as long as it has a function to transmit the data from the sense amplifier S/A0 to the bit lines BLe0 and BLo0, a circuit other than the circuit shown in FIG. 6 may be used.

Next, write-in operation (program operation) of the data of the nonvolatile semiconductor memory 10 concerning this embodiment is explained. First, write-in data is transmitted to the secondary data cache (SDC) 31 by data lines IO and IOn. Since data is transmitted in serial, the column control circuit 12 judges whether data is an even-numbered page (Even page) or an odd-numbered page (Odd page). When data is an even-numbered page (Even page) "High" is inputted into BLC1 and NMOS13 is turned on, and data is transmitted to the primary data cache (PDC) 30 and the dynamic data cache (DDC) 33. When data is an odd-numbered page (Odd page), data is transmitted to the ABL data cache (ADC) 32. Next, the data held at the primary data cache (PDC) 30 or the ABL data cache (ADC) 32 is transmitted to the bit lines BLe0 or BLo0. If data is "0 (Low)" at this time, VSS is transmitted, and if data is "1 (High)", VDD is transmitted (precharge). Here, the data held in the primary data cache (PDC) 30 is transmitted to BLe0, and the data held at the ABL data cache (ADC) 32 is transmitted to BLo0.

Here, the operation that the data held at the primary data cache (PDC) 30 or ABL data cache (ADC) 32 are transmitted to the bit lines BLe0 or BLo0 is explained in detail. First, all of BLSe, BLSo, BIASe and BIASo are set to "High", and BLCRL is set to VDD. At this time, (1) when node N1 of the primary data cache (PDC) 30 is "Low", node N1n becomes "High", and NMOS0 turns off, and NMOS2 turns on. Here, by inputting "High" into BLC1 and BLCLAMP and turning on NMOS10 and NMOS13, "Low (in this embodiment, it is VSS)" is transmitted to the even-bit line BLe0. On the other hand, (2) when node N1 of the primary data cache (PDC) 30 is "High", node N1n becomes "Low", and NMOS0 turns on, and NMOS2 turns off. Since the potential of BLCRL is VDD at this time, VDD is inputted and precharged to the even-bit line BLe0.

In addition, (3) when node N3 of the ABL data cache (ADC) 32 is "Low", node N3n becomes "High", and NMOS1 turns off, and NMOS3 turns on. Here, by inputting "High" into EVEN and turning on NMOS23, "Low (VSS)" is directly transmitted to the odd-bit line BLo0 from the ABL data cache (ADC) 32. On the other hand, (4) when node N3 is "High", node N3n becomes "Low", and NMOS1 turns on, and NMOS3 turns off. Since the potential of BLCRL is VDD at this time, VDD is inputted and precharged to the odd-bit line BLo0.

The operation described above will be performed to all of the bit lines of even number and odd number. Then, by applying write-in voltage (Vpgm) to a word line WL to which the memory cell which writes in data is connected, data can be simultaneously written in to all the memory cells on one page connected to all of the even-bit lines and odd-bit lines, and write-in speed can be improved.

Next, verify operation when writing in data will be explained referring to FIGS. 7 to 11. Because the nonvolatile semiconductor memory 10 of one embodiment of this invention concerning this embodiment adopts the voltage sense method, the influence by coupling of the bit lines adjoining each other is large. And since all of the bit lines cannot be read simultaneously, verify operation is continuously performed for every even-numbered page and odd-numbered page. Immediately after program operation, write-in data is held in the primary data cache (PDC) 30, the ABL data cache (ADC) 32. The secondary data cache (SDC) 31 needs to open data for cache operation (operation to keep a next write-in data)

Figure 7:
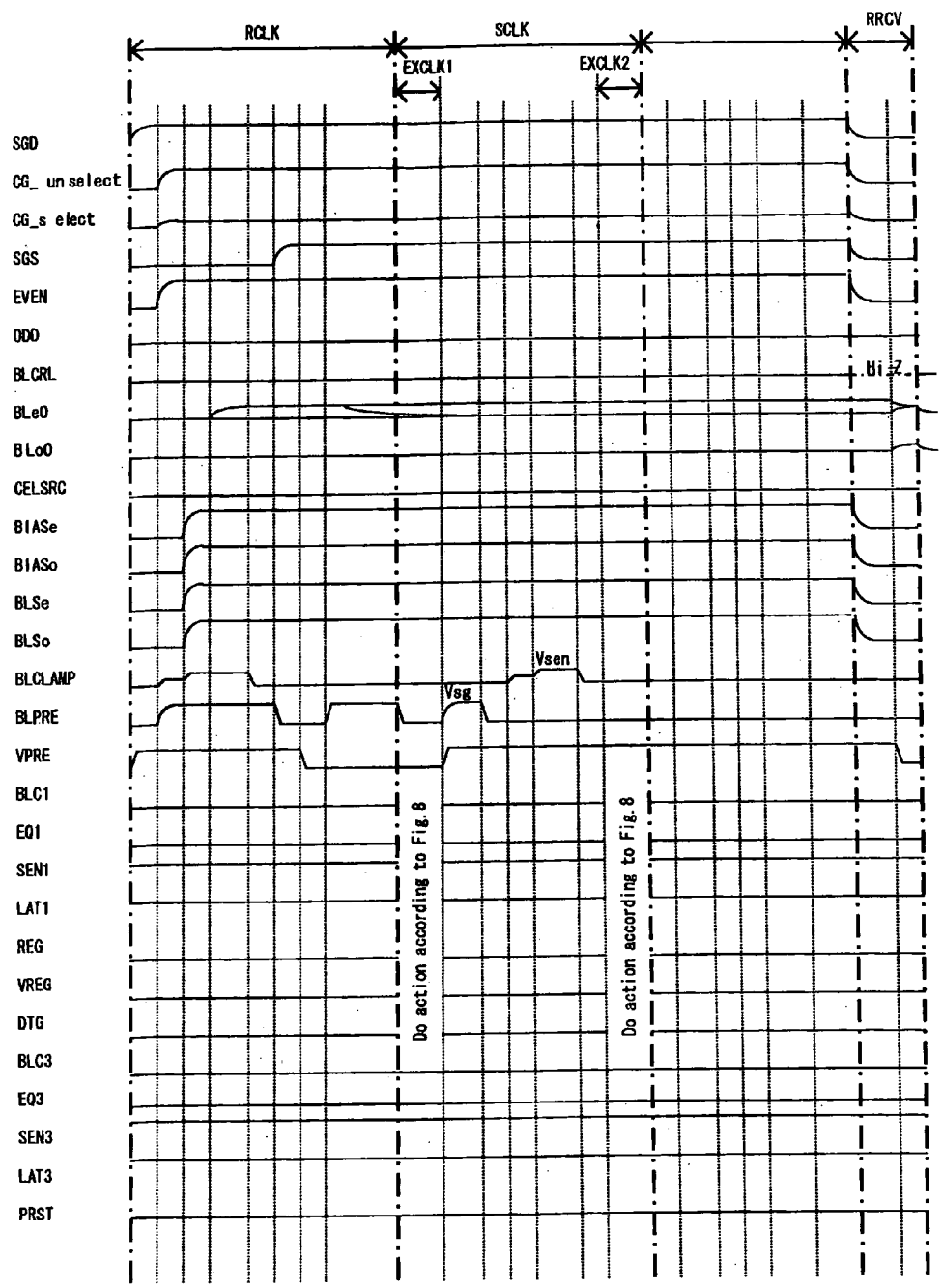
FIG. 7 is a timing chart of verify operation of the even-numbered pages concerning one embodiment of the nonvolatile semiconductor memory of one embodiment of this invention.
Figure 8:
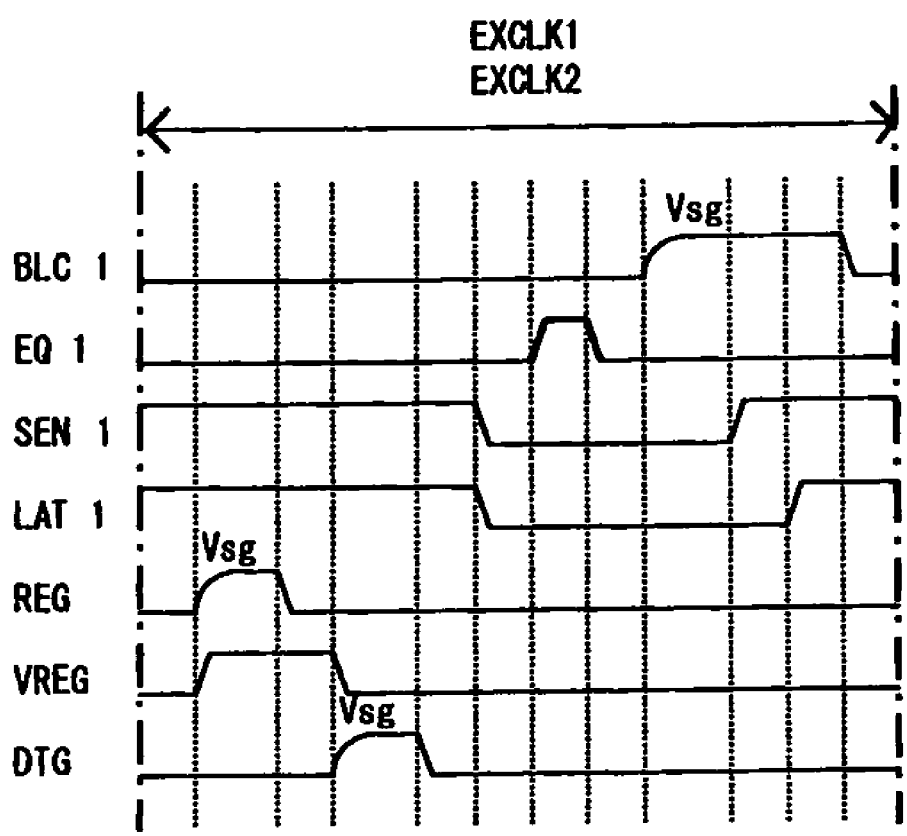
FIG. 8 is a timing chart of verify operation of the even-numbered pages concerning one embodiment of the nonvolatile semiconductor memory of one embodiment of this invention.

First, verify operation of even-numbered pages is performed. The timing chart of verify operation of this even-numbered pages is shown in FIG. 7. Although FIG. 7 shows the timing chart of the even-bit line BLe0, the odd-bit line BLo0, and the selection circuit SC0 and the sense amplifier S/A0 connected to them, the timing chart of verify operation in other bit lines is the same as what is shown in FIG. 7.

Period RCLK in FIG. 7 is referred to. It is necessary to ground all of the odd-bit lines BLo0 to BLo (n–1) to VSS for a bit line shield at the time of verify operation of the even-numbered pages. Therefore, BLCRL is set to 0V (VSS). Here, by inputting "High" into BIASo, BLSo and EVEN, (1) when node N3 of the ABL data cache (ADC) 32 is "Low", node N3n becomes "High", and NMOS1 turns off and NMOS3 turns on, and thereby data of node N3 "Low" is transmitted to the odd-bit line BLo0. On the other hand, (2) when node N3 of the ABL data cache (ADC) 32 is "High", node N3n becomes "Low", and NMOS1 turns on and NMOS3 turns off, and thereby VSS is transmitted to BLo0 from BLCRL. As a result, regardless of the data held at the ABL data cache (ADC) 32, VSS can be transmitted to the odd-bit line BLo0, and the bit line shield can be realized.

Next, it is necessary to precharge to the even-bit line BLe0. In addition, the primary data cache (PDC) 30 keeps write in data. BIASe and BLSe are set to "High" here. At this time, (1) when node N1 of the primary data cache (PDC) 30 is "High", it corresponds to non-writing, and NMOS0 turns on, and NMOS2 turns off. Therefore, VSS is charged by the even-bit line BLe0. In this case, since it corresponds to non-writing, it is not necessary to sense the potential of the bit line BLe0, and since precharge is not needed, it does not cause a problem. On the other hand, (2) when node N1 of the primary data cache (PDC) 30 is "Low", NMOS0 turns off and NMOS2 turns on. At this time, by setting VPRE to VDD, and inputting "High" into BLPRE and BLCLAMP and turning on NMOS10 and NMOS11, the even-bit line BLe0 can be precharged to VDD. Then, the data of a memory cell can be distinguished by sensing change of the potential of the even-bit line BLe0 when making the selection gate (SGS) of the subject memory cell 23 into "High".

Next, operation of period SCLK in FIG. 7 will be explained. In the timing of period EXCLK1 in FIG. 7, by performing operation shown in FIG. 8, the data held at the dynamic data cache (DDC) 33 is transmitted to the temporary data cache (TDC) 34 in sequence, and the data of node Nl held at the primary data cache (PDC) 30 is transmitted to the dynamic data cache (DDC) 33, and the data held at the temporary data cache (TDC) 34 is transmitted to node N1 of the primary data cache (PDC) 30.

Then, by impressing VDD to VPRE and inputting "High (Vsg)" into BLPRE and turning on NMOS11, the temporary data cache (TDC) 34 is precharged with VDD. Then, the even-bit line BLe0 is sensed by inputting "High" into BLCLAMP and turning on NMOS10. Depending on the potential of this even-bit line BLe0 at this moment, the temporary data cache (TDC) 34 is discharged or is held at the state charged to VDD.

Then, at the timing of period EXCLK2 in FIG. 7, operation shown in FIG. 8 is performed again. Regarding the memory cell which performed write in (node N1 of the primary data cache (PDC) 30 is "Low"), since "Low" is held at the dynamic data cache (DDC) 33, NMOS4 does not turn on, the data held at the temporary data cache (TDC) 34 is taken into node N1 of the primary data cache (PDC) 30. As a result, since the writing of data is inadequate when (1) the temporary data cache (TDC) 34 holds "Low", data writing is performed again in the next program operation. On the other hand, since the writing of data is completed when (2) temporary data cache (TDC) 34 holds "High", writing of data is not performed in the next program operation. Regarding the memory cell which data has already written in or non-writing (node N1 of the primary data cache (PDC) 30 is "High"), since "High" is held at the dynamic data cache (DDC) 33, NMOS4 turns on, and VDD is impressed to VREG, "High" is inputted into REG and NMOS12 turns on, the temporary data cache (TDC) 34 is automatically charged to VDD. Thereby, "High" is again inputted into node N1 of the primary data cache (PDC) 30, and the subject memory cell becomes non-writing in a next program. The period after period SCLK is needed when middle potential (QPW) needs to be written to a bit line.

Figure 9:
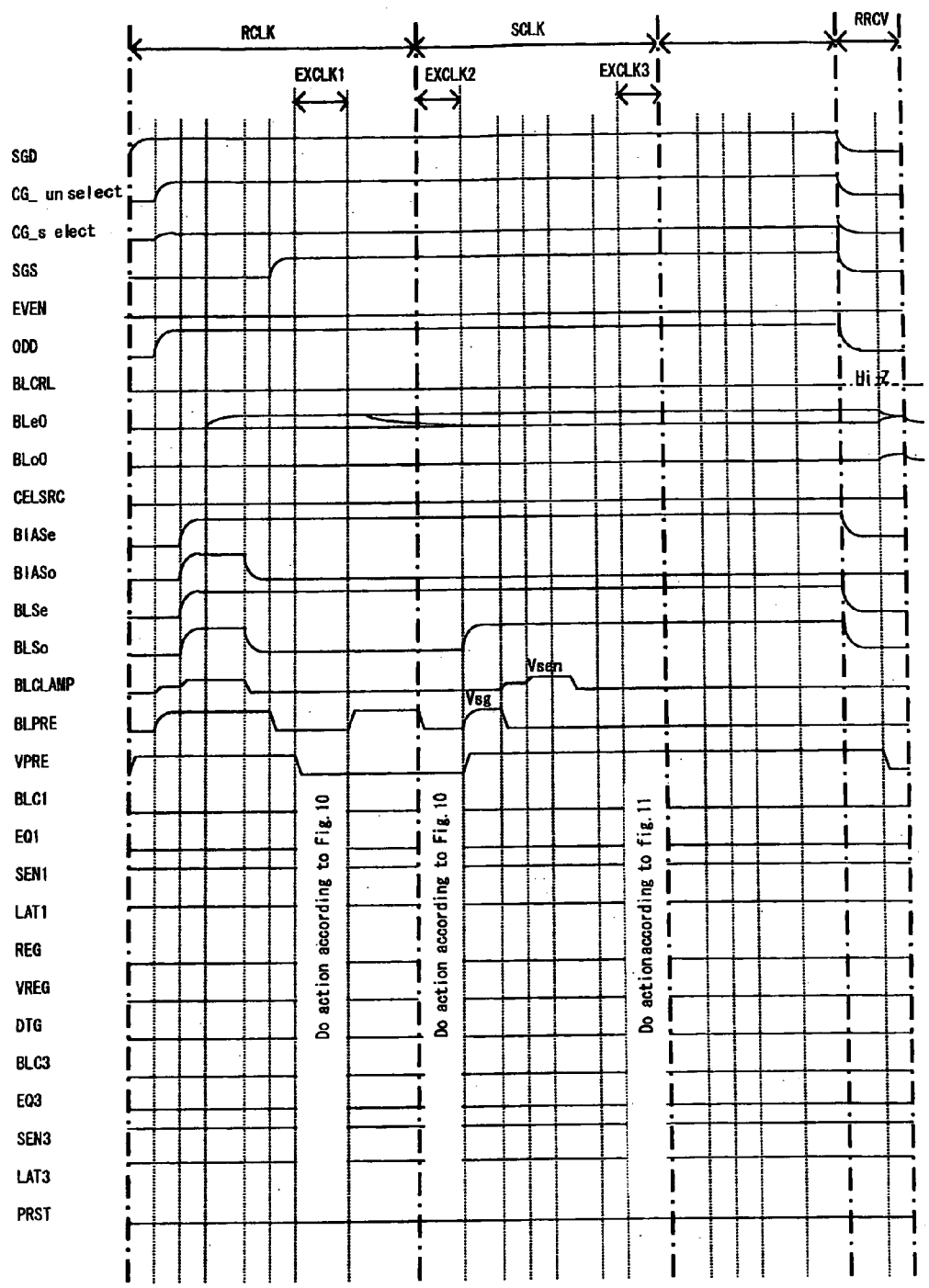
FIG. 9 is a timing chart of verify operation of the odd-numbered pages concerning one embodiment of the nonvolatile semiconductor memory of one embodiment of this invention.
Figure 10:
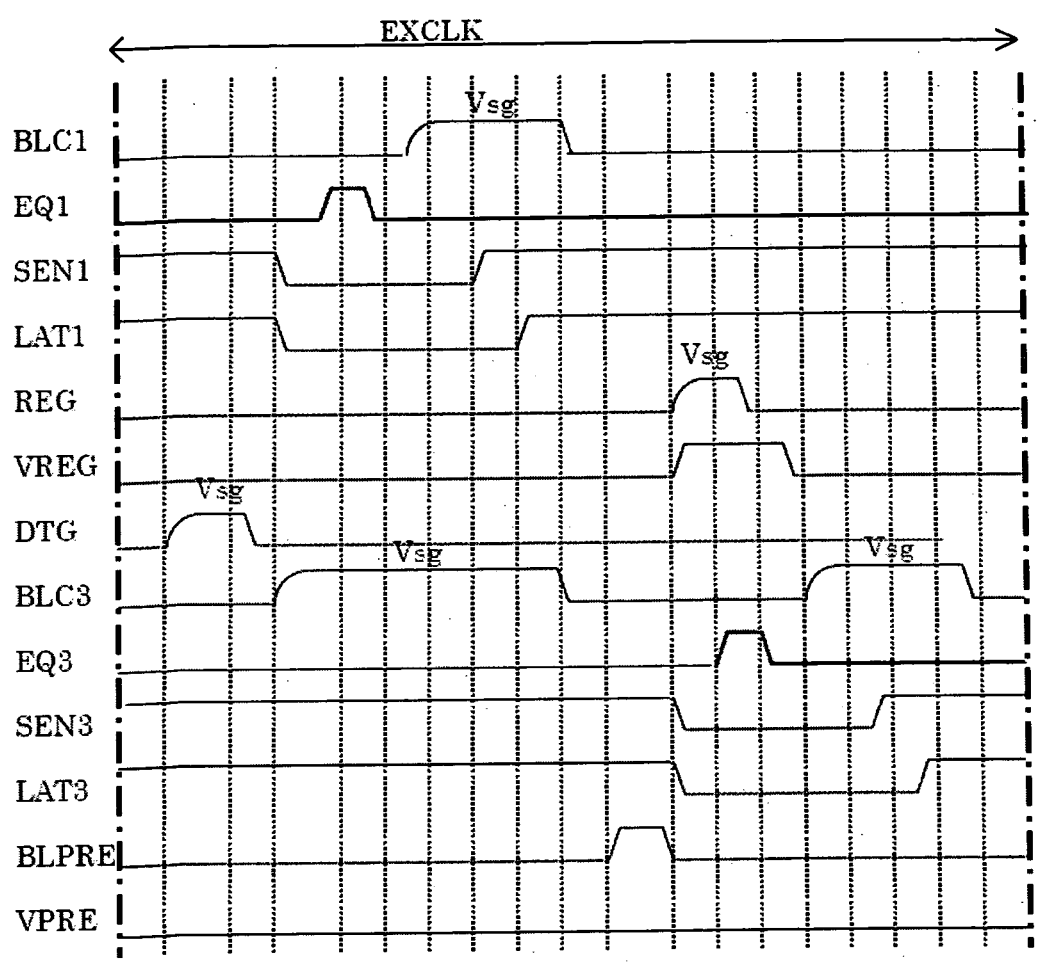
FIG. 10 is a timing chart of verify operation of the odd-numbered pages concerning one embodiment of the nonvolatile semiconductor memory of one embodiment of this invention.

Subsequently, verification operation of the odd-numbered page is performed. The timing chart at this time is shown in FIG. 9. Although FIG. 9 shows the timing chart of the even-bit line BLe0, the odd-bit line BLo0 and the selection circuit SC0 and the sense amplifier S/A0 connected to them, the timing chart of verify operation in other bit lines is the same as what is shown in FIG. 9.

Period RCLK in FIG. 9 is referred to. First, the odd-bit line BLo0 is precharged. BLCRL is set to 0V (VSS). "High" is first inputted into ODD, BIASo and BLSo. (1) When node N3 of the ABL data cache (ADC) 32 is "Low", node N3n becomes "High" and NMOS3 turns on. At this time, by setting VPRE to VDD and inputting "High" into BLPRE and BLCLAMP and turning on NMOS10 and NMOS11, the odd-bit line BLo0 can be precharged to VDD. On the other hand, (2) when node N3 of the ABL data cache (ADC) 32 is "High", node N3n becomes "Low", NMOS1 turns on, and VSS is transmitted to the odd-bit line BLo0 from BLCRL. Since the memory cell corresponds to non-writing at this time and it is not necessary to sense, precharge is no need to perform.

Regarding verify operation of the odd-bit line BLo0, as well as the even-bit line BLe0, in order to carry out using the primary data cache (PDC) 30, it is necessary to replace the data of the primary data cache (PDC) 30 and that of the ABL data cache (ADC) 32. Then, in period EXCLK1 in FIG. 9, the data of the primary data cache (PDC) 30 and that of the ABL data cache (ADC) 32 is replaced by performing operation shown in FIG. 10.

First, "High" is inputted into DTG, NMOS9 is turned on and the data of node N1 of the primary data cache (PDC) 30 is transmitted to the dynamic data cache (DDC) 33. Next, the data of node N3 of the ABL data cache (ADC) 32 is transmitted to node N1 of the primary data cache (PDC) 30 by inputting "High" into BLC1 and BLC3, and turning on NMOS13 and NMOS14. Finally, the data of the dynamic data cache (DDC) 33 is transmitted to node N3 of the ABL data cache (ADC) 32, and exchange of the data of the primary data cache (PDC) 30 and the ABL data cache (ADC) 32 is completed.

In order to perform a bit line shield, it is necessary to ground the even-bit line BLe0 to VSS. However, since the data of the primary data cache (PDC) 30 is write-in data of the ABL data cache (ADC) 32, the same method as the time of the shield of the odd-bit line BLo0 at the time of verify operation of even-bit line mentioned above cannot be performed. Then, VSS is transmitted from BLCRL by inputting "High" into ODD and turning on NMOS0. Then, the data of the memory cell can be distinguished by sensing change of the potential of the odd-bit line BLo0 when making the selection gate (SGS) of the subject memory cell into "High". However, since the data of the even-numbered pages is held at the ABL data cache (ADC) 32 at this time, depending on such data, NMOS3 connected to the odd-bit line BLo0 which is writing in data may not turn on, and the sense of the odd-bit line BLo0 may not be performed.

Then, the sense of the odd-numbered page in consideration of the above is explained. By impressing VSS to VPRE, inputting "High" into BLPRE, and turning on NMOS11 after the end of period EXCLK1 in FIG. 9, the temporary data cache (TDC) 34 is discharged. Next, by performing operation again shown in FIG. 10 during period EXCLK2 in period SCLK, the data held at the primary data cache (PDC) 30 is transmitted to the dynamic data cache (DDC) 33. The data of node N3 held at the ABL data cache (ADC) 32 is transmitted to the primary data cache (PDC) 30, and the data held at the dynamic data cache (DDC) 33 is transmitted to node N3 of the ABL data cache (ADC) 32 successively. By doing this, the data of the even-numbered pages return to the primary data cache (PDC) 30, and the data of the odd-numbered pages return to the ABL data cache (ADC) 32. By returning the data of the odd-numbered pages to the ABL data cache (ADC) 32, NMOS3 connected to the odd-bit line BLo0 to be sensed turns on.

Figure 11:
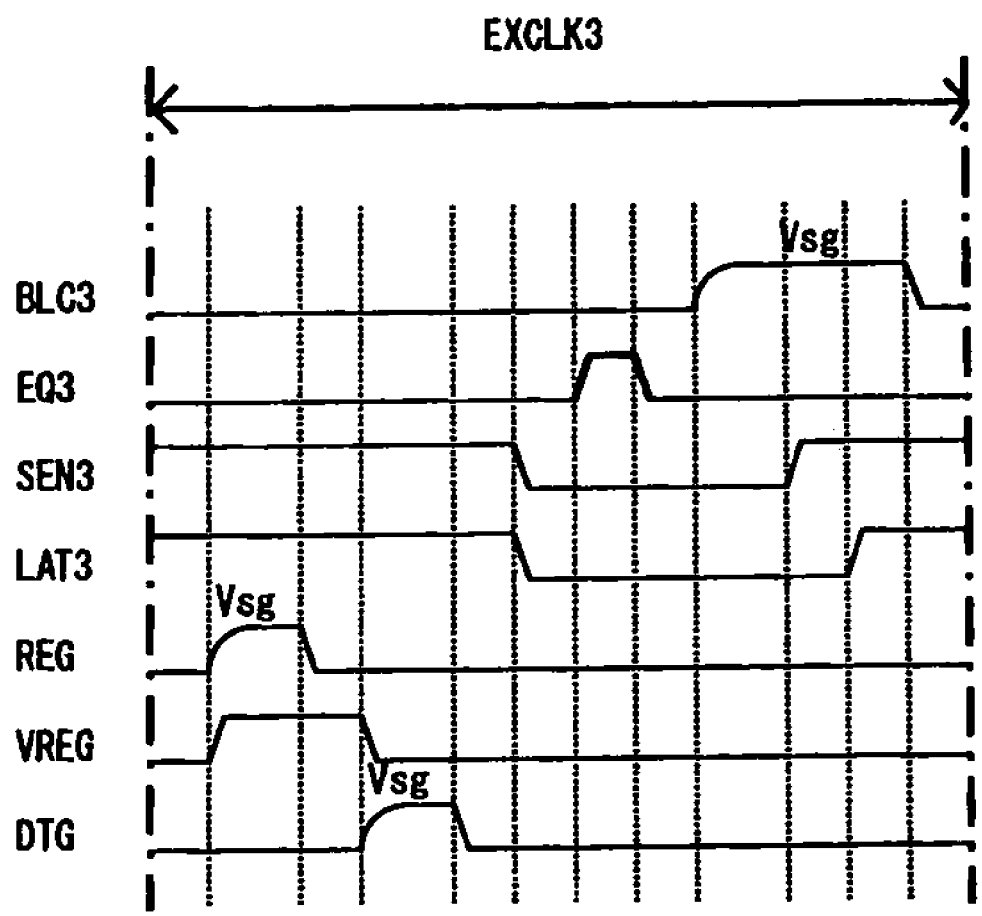
FIG. 11 is a timing chart of verify operation of the odd-numbered pages in one embodiment of the nonvolatile semiconductor memory of one embodiment of this invention.

Then, by impressing VDD to VPRE and inputting "High" into BLPRE and turning on NMOS11, the temporary data cache (TDC) 34 is precharged by VDD. And the odd-bit line BLo0 is sensed by inputting "High" into BLCLAMP and turning on NMOS10. Depending on the potential of the odd-bit line BLo0 at this time, the temporary data cache (TDC) 34 is discharged, or the state that it is charged at VDD is held. Then, operation in FIG. 11 is performed in period EXCLK3 in FIG. 9. Regarding the memory cell which performs write in (node N3 of the ABL data cache (ADC) 32 is "Low"), since "Low" is held at the dynamic data cache (DDC) 33, NMOS4 does not turn on, the data held at the temporary data cache (TDC) 34 is downloaded to node N3 of the ABL data cache (ADC) 32. As a result, (1) when node N3 of the ABL data cache (ADC) 32 holds "Low" since the writing of data is inadequate, data is again written in the next program operation. On the other hand, (2) when node N3 of the ABL data cache (ADC) 32 is "High", since the writing of data is completed, data writing is not performed in the next program operation. In the non-writing in memory cell originally (node N3 of the ABL data cache (ADC) 32 is "High"), since "High" is held at the dynamic data cache (DDC) 33, Since NMOS4 turns on, and VDD is impressed to VREG, and "High" is inputted into REG and NMOS12 turns on, the temporary data cache (TDC) 34 is automatically charged to VDD. Thereby, "High" is again inputted into node N3 of the ABL data cache (ADC) 32, and the subject memory cell will be non-writing also in a next program.

In this embodiment, although the dynamic data cache (DDC) 33 is connected to the primary data cache (PDC) 30, the dynamic data cache (SDC) 33 may be connected to the ABL data cache (ADC) 32. In addition, both of the primary data cache (PDC) 30 and the ABL data cache (ADC) may have one dynamic data cache (DDC) 33. Thereby, operations including QPW will be possible.

As mentioned above, in the nonvolatile semiconductor memory 10 of one embodiment of this invention concerning this embodiment, after writing in data simultaneously in the even-bit lines and the odd-bit lines, it is possible to perform verify operation of the even-numbered pages and verify operation of the odd-numbered pages continuously. The nonvolatile semiconductor memory 10 of one embodiment of this invention concerning this embodiment suppresses the increase in the occupation area by an additional circuit as much as possible and effective write-in speed of the nonvolatile semiconductor memory is improved.

EXAMPLE 1

Next, another example of the nonvolatile semiconductor memory of one embodiment of this invention is explained. The nonvolatile semiconductor memory of one embodiment of this invention concerning this embodiment changes the circuit structure of the sense amplifier 19 and the selection circuit 20 in the nonvolatile semiconductor memory 10 explained in the above-mentioned embodiment.

Figure 12:
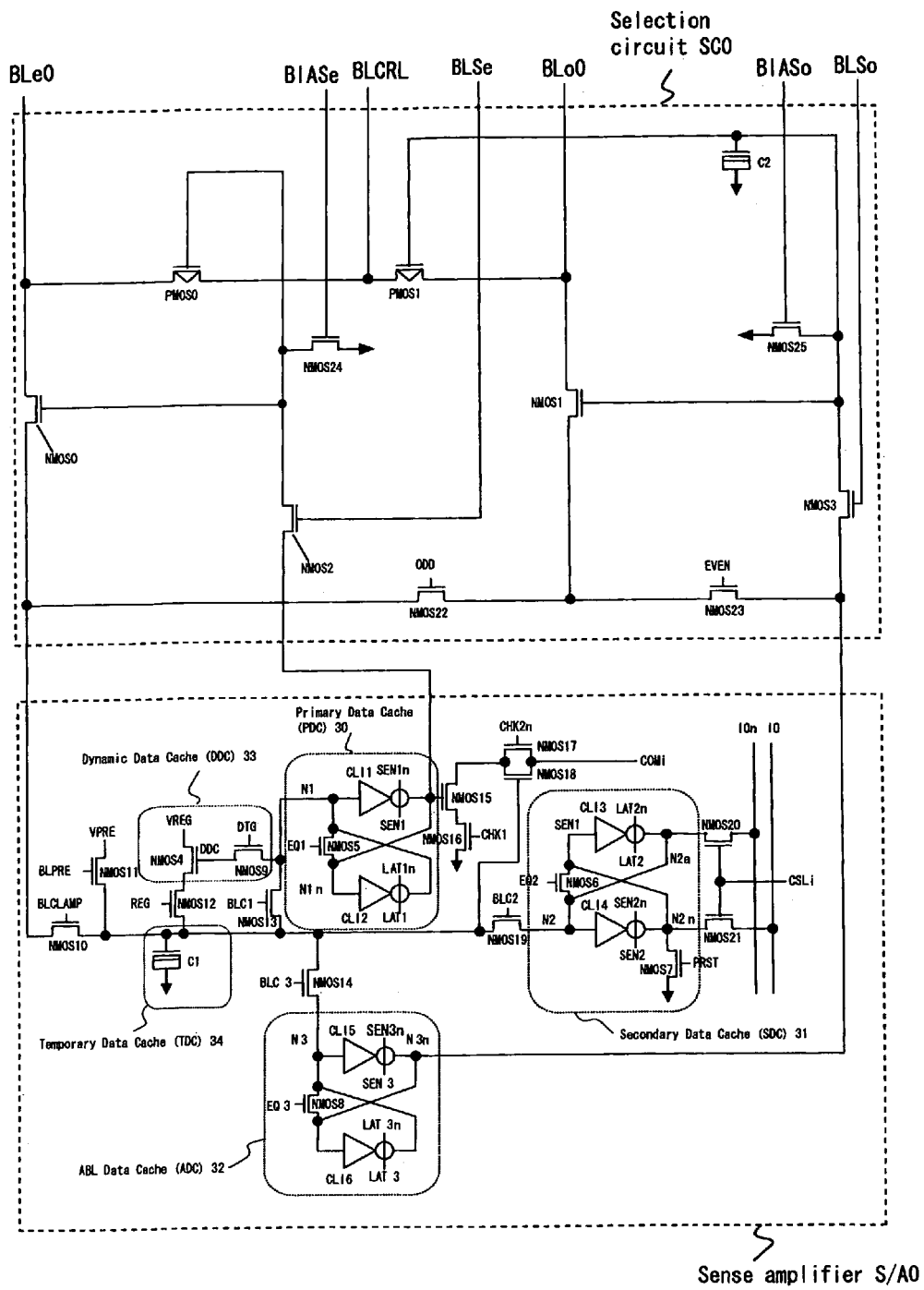
FIG. 12 shows the circuit structure of the sense amplifier and the selection circuit concerning one embodiment of the nonvolatile semiconductor memory of one embodiment of this invention.

FIG. 12 shows the circuit structure of the selection circuit 20 and the sense amplifier 19 of the nonvolatile semiconductor memory 10 of one embodiment of this invention concerning this embodiment. Although FIG. 12 typically shows the sense amplifier SA0 and the selection circuit SC0 connected to the even-bit line BLe0 and the odd-bit line BLo0 for convenience of the drawing, the same circuit structure applies to other sense amplifier SA1 to SA (n−1) and selection circuits SC1 to SC (n−1). In addition, since other circuits which constitute the nonvolatile semiconductor memory 10 are the same as that of what is explained in the above-mentioned embodiment, it does not explain anew here.

Compared with the selection circuit SC0 shown in FIG. 6 explained in the above-mentioned embodiment, the selection circuit SC0 of this embodiment changes part of N channel type transistors to P channel type transistor, and thereby the whole number of elements is decreased. The selection circuit SC0 of this embodiment has the N channel type transistors (NMOS0 to NMOS3, NMOS22 to NMOS25), the P channel type transistors (PMOS0, PMOS1) and the capacity C2. Since the circuit structure of the sense amplifier S/A0 is as same as that of what is explained in FIG. 6, it is not explained anew here.

Here, write-in operation (program operation) of the data of the nonvolatile semiconductor memory 10 of one embodiment of this invention concerning this embodiment is explained. First, write-in data is transmitted to the primary data cache (PDC) 30 and the ABL data cache (ADC) 32.

Next, the data held at the primary data cache (PDC) 30 and the ABL data cache (ADC) 32 are transmitted to the bit line BLe0 or BLo0. At this time, when data "0 (Low)" is written in, VSS is transmitted. When data "1 (High)" is written in, VDD is transmitted and precharge is performed. Here, as same as the above-mentioned embodiment, the data of the primary data cache (PDC) 30 will be transmitted to the even-bit line BLe0, and the data of the ABL data cache (ADC) 32 will be transmitted to the odd-bit line BLo0.

Here, operation that the data held at the primary data cache (PDC) 30 and the ABL data cache (ADC) 32 is transmitted to the bit line BLe0 or BLo0 is explained in detail. First, BLSe and BLSo are set to "High". In addition, BLCRL is set to VDD. (1) when node N1 of the primary data cache (PDC) 30 is "Low" at this time, node N1n becomes "High", and NMOS0 turns on, and PMOS0 turns off. Here, by impressing VSS to VPRE and inputting "High" into BLPRE and turning on NMOS11, "Low (in this embodiment, VSS)" can be transmitted to the even-bit line BLe0. On the other hand, (2) when node N1 of the primary data cache (PDC) 30 is "High", node N1n becomes "Low" and PMOS0 turns on. Since the potential of BLCRL is VDD at this time, VDD is inputted and precharged to the even-bit line BLe0.

(3) When node N3 of the ABL data cache (ADC) 32 is "Low", node N3n becomes "High", and NMOS1 turns on, and PMOS1 turns off. At this time, by impressing VSS to VPRE and inputting "High" to BLPRE and turning on NMOS11, VSS can be transmitted to the odd-bit line BLo0. On the other hand, (4) when node N3 of the ABL data cache (ADC) 32 is "High", node N3n becomes "Low" and PMOS1 turns on. Since the potential of BLCRL is VDD at this time, VDD is inputted and precharged to the odd-bit line BLo0.

The above operation will be performed in all the bit lines of even number and odd number. Then, by impressing writing voltage (Vpgm) to the word line WL that the memory cell which writes in data is connected, writing in can be performed simultaneously to all the memory cells on one page connected to all the even-bit lines and odd-bit lines, and write-in speed can be improved.

Next, verify operation at the time of writing in data is explained. As already stated, the nonvolatile semiconductor memory 10 of one embodiment of this invention concerning this embodiment adopts the voltage sense method, since the influence by coupling of the mutually adjoining bit lines is large and all the bit lines cannot be read simultaneously, verification operation is continuously performed by every even-numbered page and odd-numbered page. Immediately after program operation, the primary data cache (PDC) 30 and the ABL data cache (ADC) 32 holds write in data. The secondary data cache (SDC) 31 needs to open data for cache operation (operation keeping next write-in data).

Figure 13:
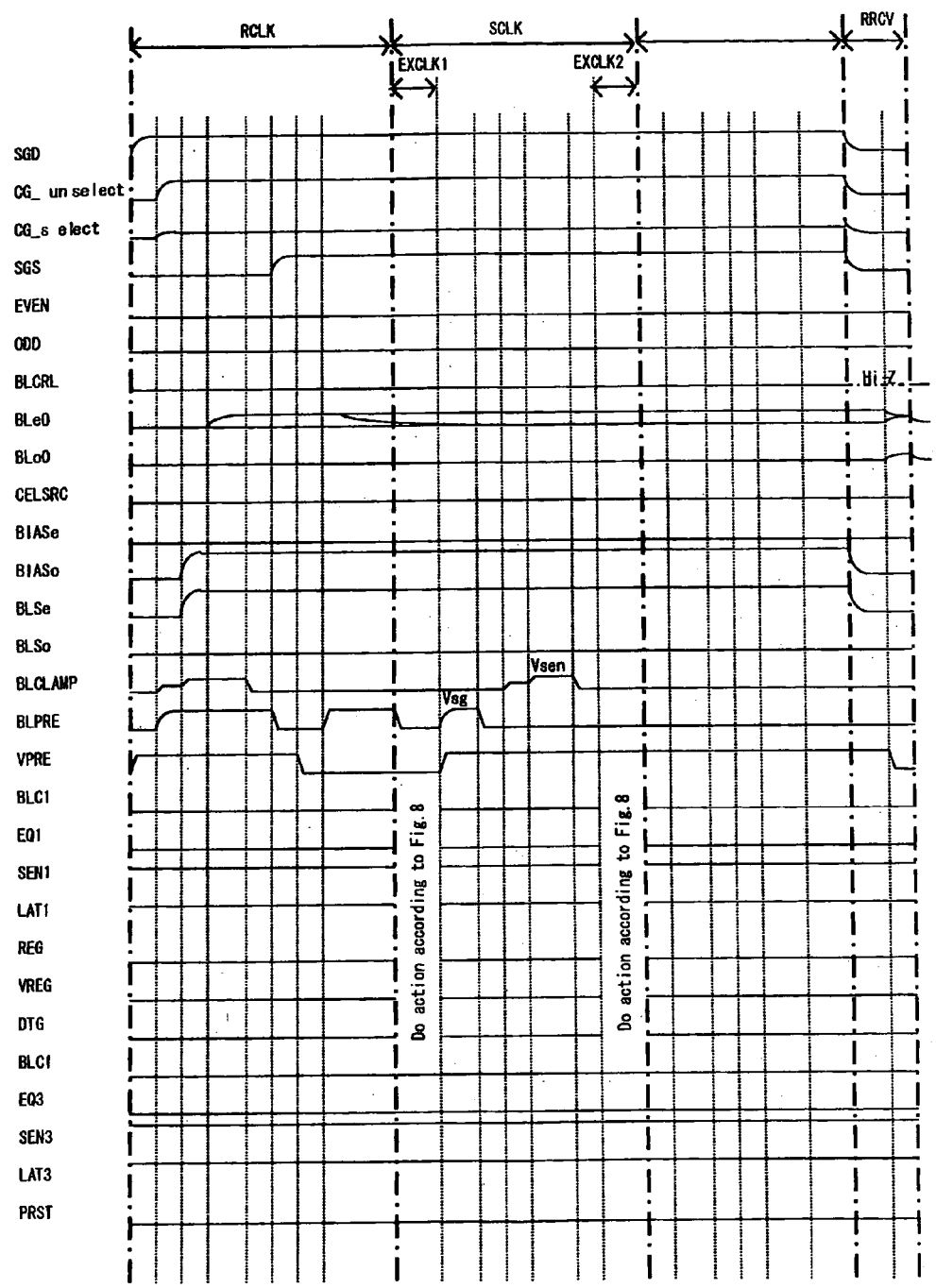
FIG. 13 is a timing chart of verify operation of the even-numbered pages concerning one embodiment of the nonvolatile semiconductor memory of one embodiment of this invention.

First, verify operation of the even-numbered pages is performed. The timing chart of verify operation of this even-numbered pages is shown in FIG. 13. Although FIG. 13 shows the timing chart in the even-bit line BLe0, the odd-bit line BLo0, the selection circuit SC0 and the sense amplifier S/A0 connected to the even-bit line BLe0 and the odd-bit line BLo0, the timing chart of verify operation in other bit lines is the same as that of what is shown in FIG. 13.

Period RCLK in FIG. 13 is referred to. When verifying the even-numbered pages, it is necessary to ground the odd-bit lines BLo0 to BLo (n−1) to VSS for the bit line shield. Therefore, BLCRL is set to 0V (VSS) and BIASo is turned on. By this, PMOS1 turns on, the odd-bit line BLo0 is set to VSS, and the bit line shield can be realized.

Next, it is necessary to precharge to the even-bit line BLe0. The primary data cache (PDC) 30 holds write in data. Here, BLSe is set to "High". (1) When node N1 of the primary data cache (PDC) 30 is "High" at this time, it corresponds to non-writing, and node N1n becomes "Low", and PMOS0 turns on, and NMOS0 turns off. Therefore, VSS is charged to the even-bit line BLe0. In this case, since it corresponds to non-writing, it is not necessary to sense the potential of the even-bit line BLe0, and since precharge is not needed, it does not cause a problem. On the other hand, (2) when node N1 of the primary data cache (PDC) 30 is "Low", node N1n becomes "High", and PMOS0 turns off, and NMOS0 turns on. At this time, by impressing VDD to VPRE and inputting "High" into BLPRE and BLCLAMP and turning on NMOS10 and MOS11, the even-bit line BLe0 can be precharged to VDD. Then, the data of a memory cell can be distinguished by sensing change of the potential of the even-bit line BLe0 when making the selection gate (SGS) of the subject memory cell 23 into "High". Since the method of the sense is the same as the method explained in the above-mentioned embodiment, explanation is omitted here.

Figure 14:
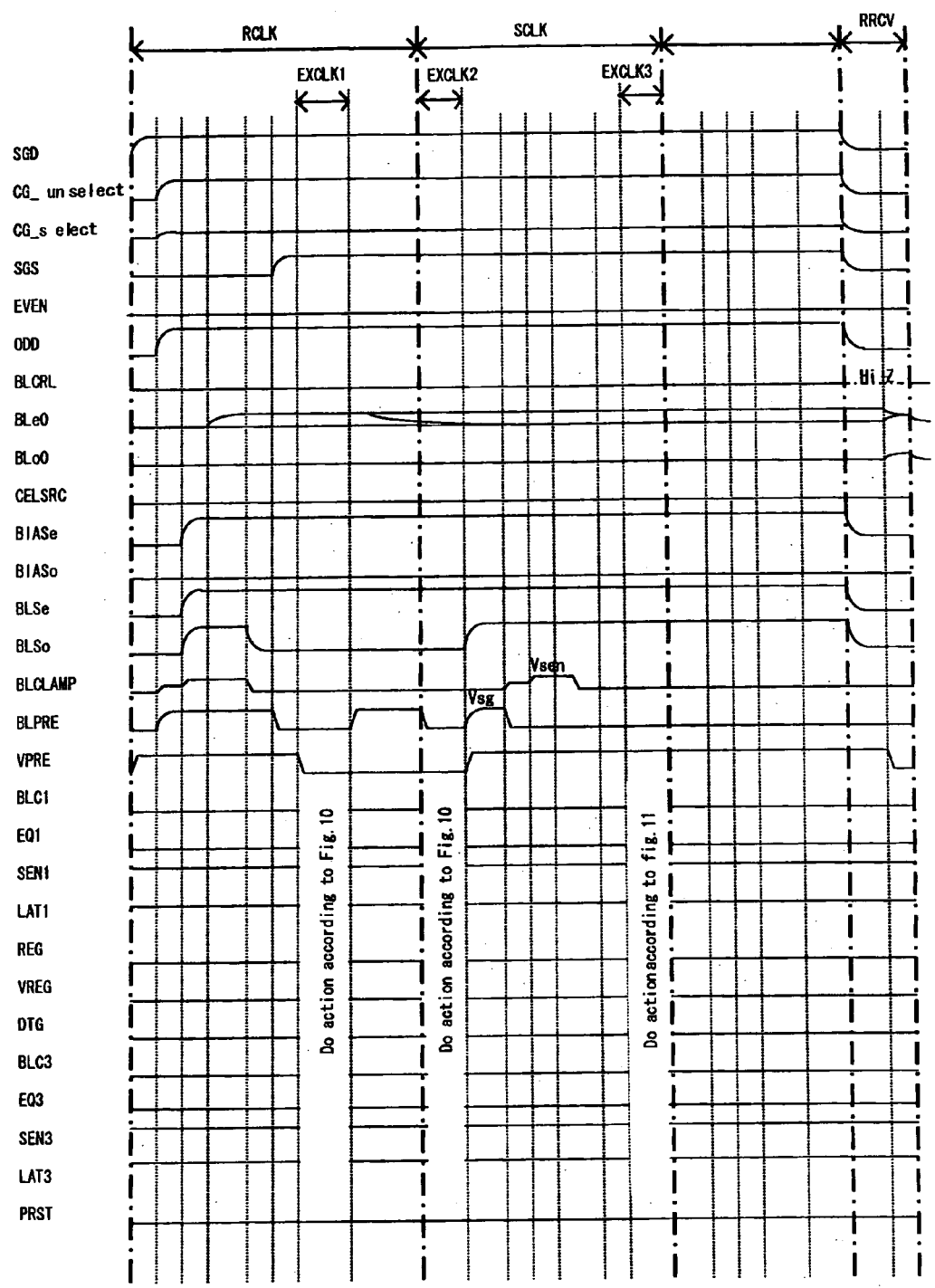
FIG. 14 is a timing chart of verify operation of the odd-numbered pages in one embodiment of the nonvolatile semiconductor memory of one embodiment of this invention.

Successively, verification operation of the odd-numbered pages is performed. The timing chart at this time is shown in FIG. 14. Although FIG. 14 shows the timing chart in the even-bit line BLe0, the odd-bit line BLo0, the selection circuit SC0 and the sense amplifier S/A0 connected to the even-bit line BLe0 and the odd-bit line BLo0, the timing chart of verify operation in other bit lines is the same as that of what is shown in FIG. 14.

Period RCLK in FIG. 9 is referred to. First, BLCRL is set to 0V (VSS) and "High" is inputted into BIASe. By this, PMOS0 turns on, the even-bit line BLe0 is set to VSS, and the bit line shield can be realized. Next, the odd-bit line BLo0 is precharged. First, "High" is inputted into BLSo. Here, (1) when node N3 of the ABL data cache (ADC) 32 is "Low", node N3n is set to "High"1 and NMOS1 turns on. At this time, by impressing VDD to VPRE, and inputting "High" into BLPRE, BLCLAMP and ODD, and turning on NMOS10, NMOS11 and NMOS22, the odd-bit line BLo0 can be precharged to VDD. On the other hand, (2) when node N3 of the ABL data cache (ADC) 32 is "High", node N3n becomes "Low", PMOS1 turns on, and VSS is transmitted to the odd-bit line BLo0 from BLCRL. Since a cell corresponds to non-writing at this time, it does not cause a problem even if precharge is not performed. Setting BLSo into "Low" turns off NMOS3, and the gate voltage of PMOS1 and NMOS1 is held by a capacitor including C2. Regarding verify operation of odd-bit line BLo0, in order to carry out using the primary data cache (PDC) 30 as well as the even-bit line BLe0, it is necessary to replace the data of the primary data cache (PDC) 30 and the data of the ABL data cache (ADC) 32. Since the method of exchange of this data is the same as that of the method explained in the above-mentioned embodiment, it is not explained anew here.

Then, the data of the memory cell can be distinguished by sensing change of the potential of the odd-bit line BLo0 when making the selection gate (SGS) of the subject memory cell 23 into "High". Since the method of a sense is the same as the method explained in the above-mentioned embodiment, its explanation is omitted here.

In this embodiment, although the dynamic data cache (DDC) 33 is connected to the primary data cache (PDC) 30, the dynamic data cache (SDC) 33 may be connected to the ABL data cache (ADC) 32. In addition, both of the primary data cache (PDC) 30 and the ABL data cache (ADC) may have one dynamic data cache (DDC) 33. Thereby, operations including QPW will be possible.

As mentioned above, in the nonvolatile semiconductor memory 10 of one embodiment of this invention concerning this embodiment, after writing in data simultaneously in the even-bit line and the odd-bit line, it is possible to perform verify operation of the even-numbered pages and verify operation of the odd-numbered pages continuously. The nonvolatile semiconductor memory 10 of one embodiment of this invention concerning this embodiment suppresses the increase in the occupied area due to an additional circuit as much as possible, and effective write-in speed of the nonvolatile semiconductor memory is improved. Further, in the nonvolatile semiconductor memory of this embodiment, without performing charge and discharge of the bit line from data cache, since charge and discharge can be carried out from VPRE, BLCRL, and BIAS altogether to operate, size of each data cache can be smaller than before.

EXAMPLE 2

The nonvolatile semiconductor memory 10 of one embodiment of this invention explained in the above-mentioned embodiment and the above-mentioned example 1 can perform precharge of the bit line with a pressor voltage to a non-writing cell from BLCRL directly when writing in data from the ABL data cache (ADC) 32 as shown in FIGS. 6 and 12. Thereby, voltage higher than VDD can be flowed by connecting BLCRL with an external power supply or a pressor circuit. As a result, higher voltage can be transmitted to the channel to the non-writing in memory cell, and incorrect writing can be decreased. In the example shown in FIG. 12, by using a P channel type transistor, as same as the case using an N channel type transistor, voltage can be transmitted while avoiding lowering of voltage by a threshold amount.

While chip areas are not nearly increased, the nonvolatile semiconductor memory of one embodiment of this invention can realize improvement in the speed of write-in operation, and it can realize speed up of the whole system of a NAND type flash memory. Therefore, according to one embodiment of the present invention, a nonvolatile semiconductor memory, which is cheaper, small size, a high speed and large capacity, can be realized. The nonvolatile semiconductor memory of one embodiment of this invention can be used as memory storage of electronics including a computer, a digital camera, a cellular phone and home electronics.

What is claimed is:

1. A nonvolatile semiconductor memory device comprising:
   a memory cell array in which a plurality of electrically rewritable nonvolatile memory cells is arranged; and
   a sense amplifier having first, second and third circuits holding write-in data, said first circuit receiving data from the outside and transmits said data to said second circuit and said third circuit, said second circuit and said third circuit transmitting said data to two adjacent bit lines respectively; and
   wherein said data is written in simultaneously to memory cells selected among said nonvolatile memory cells connected to said two adjacent bit lines.

2. The nonvolatile semiconductor memory device according to claim 1, wherein said first circuit and second and third circuits are first, second and third data cache circuits, respectively.

3. The nonvolatile semiconductor memory device according to claim 2, wherein said first, second and third data cache circuits are latch circuits, respectively.

4. The nonvolatile semiconductor memory device according to claim 3, wherein said second and third data cache circuit have two clocked inverters and one transistor, respectively.

5. The nonvolatile semiconductor memory according to claim 4, further comprising selection circuits, said selection circuits having a plurality of transistors and a plurality of logic circuits controlling gate electrodes of a plurality of said transistors, wherein said second and third data cache circuit control a plurality of said logic circuits, respectively.

6. The nonvolatile semiconductor memory device according to claim 5, further comprising a dynamic data cache circuit.

7. The nonvolatile semiconductor memory device according to claim 6, wherein said dynamic data cache circuit holds data for writing middle potential between high potential and low potential in a bit line.

8. The nonvolatile semiconductor memory device according to claim 7, the bit line is directly precharged with a pressor voltage at the timing of said data cache transmitting the data to the bit line.

9. The nonvolatile semiconductor memory device according to claim 8, further comprising a temporary data cache circuit consisting of capacity.

10. The nonvolatile semiconductor memory device according to claim 9, wherein said memory cell array has a structure which a plurality of said memory cells are connected between two selection gates.

11. The nonvolatile semiconductor memory device according to claim 10, wherein said memory cells have a structure in which an electric charge accumulation layer and a control gate are laminated.

12. A nonvolatile semiconductor memory device comprising:
    a memory cell array in which a plurality of electrically rewritable nonvolatile memory cells is arranged;
    a sense amplifier having first, second and third latch circuits holding write-in data, said first latch circuit receiving data from the outside and transmitting said data to said second latch circuit and said third latch circuit, and said second latch circuit and said third latch circuit transmitting said data to two adjacent bit lines respectively through a selection circuit; and
    the selection circuit controlling transmission of said data from said second latch circuit and said third latch circuit to two adjacent bit lines,
    wherein said data is written in simultaneously to memory cells selected among said nonvolatile memory cells connected to said two adjacent bit lines.

13. The nonvolatile semiconductor memory device according to claim 12, further comprising a dynamic data cache circuits.

14. A method of operating a nonvolatile semiconductor memory device comprising:
    a memory cell array in which a plurality of electrically rewritable nonvolatile memory cells is arranged; and
    a sense amplifier having first, second and third circuits holding write-in data;
    said method comprising:
    said first circuit receiving data from the outside and transmitting said data to said second circuit and said third circuit,
    said second circuit and said third circuit transmitting said data to two adjacent bit lines respectively, and said data being written in simultaneously to memory cells selected among said nonvolatile memory cells connected to said two adjacent bit lines.

15. The method of operating a nonvolatile semiconductor memory device according to claim 14, wherein said first circuit and second and third circuits are first, second and third data cache circuits, respectively.

16. The method of operating a nonvolatile semiconductor memory device according to claim 15, wherein the said first, second and third data cache circuits are latch circuits, respectively.

17. The method of operating a nonvolatile semiconductor memory device according to claim 16, wherein said second and third data cache circuit have two clocked inverters and one transistor, respectively.

18. The method of operating a nonvolatile semiconductor memory device according to claim 17, further comprising selection circuits, said selection circuits having a plurality of transistors and a plurality of logic circuits controlling gate electrodes of a plurality of said transistors, wherein said second and third data cache circuit control a plurality of said logic circuits, respectively.

19. The method of operating a nonvolatile semiconductor memory device according to claim 18, said nonvolatile semiconductor memory device further comprising a dynamic data cache circuit.

20. The method of operating a nonvolatile semiconductor memory device according to claim 19, wherein said two adjacent bit lines are directly precharged with a pressor voltage at the timing of said data cache transmitting the data to the bit line.

* * * * *